(12) United States Patent
Lee

(10) Patent No.: US 8,254,176 B2
(45) Date of Patent: Aug. 28, 2012

(54) EEPROM DEVICE

(75) Inventor: Yong Seop Lee, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 79 days.

(21) Appl. No.: 12/893,650

(22) Filed: Sep. 29, 2010

(65) Prior Publication Data

US 2011/0157991 A1 Jun. 30, 2011

(30) Foreign Application Priority Data

Dec. 31, 2009 (KR) .................. 10-2009-0135263
Dec. 31, 2009 (KR) .................. 10-2009-0135299

(51) Int. Cl.
*G11C 16/04* (2006.01)
(52) U.S. Cl. ............... 365/185.18; 365/185.29
(58) Field of Classification Search ............ 365/185.18, 365/185.29
See application file for complete search history.

(56) References Cited

U.S. PATENT DOCUMENTS 6,785,166 B2* 8/2004 Iwahashi .................. 365/185.28
2003/0189865 A1* 10/2003 Ausserlechner et al. ..... 365/200
2005/0007824 A1* 1/2005 Chih ........................ 365/185.18

* cited by examiner

*Primary Examiner* — Huan Hoang
(74) *Attorney, Agent, or Firm* — Sherr & Vaughn, PLLC

(57) ABSTRACT

A stable and reliable EEPROM device includes an EEPROM cell having first, second and third control voltage terminals for performing operations for programming, reading and erasing data, respectively, a first transistor configured to supply a programming operation voltage to the first control voltage terminal during the programming operation, a second transistor configured to supply a ground voltage to the first control voltage terminal, the data of which will not be programmed during the programming operation, and a third transistor connected to the second control voltage terminal and turned on by an address selected for reading the data of the EEPROM cell during the reading operation.

20 Claims, 3 Drawing Sheets

EEPROM DEVICE

The present application claims priority under 35 U.S.C. §119 to Korean Patent Application Nos. 10-2009-0135263 and 10-2009-0135299 (filed on Dec. 31, 2009), which are each hereby incorporated by reference in their respective entireties.

BACKGROUND

Semiconductor memory devices are widely used. Representative examples of semiconductor devices include an Electrically Erasable Programmable Read-Only Memory (EEPROM) capable of performing writing, reading and erasing operations by applying different control voltages.

Figure 1:
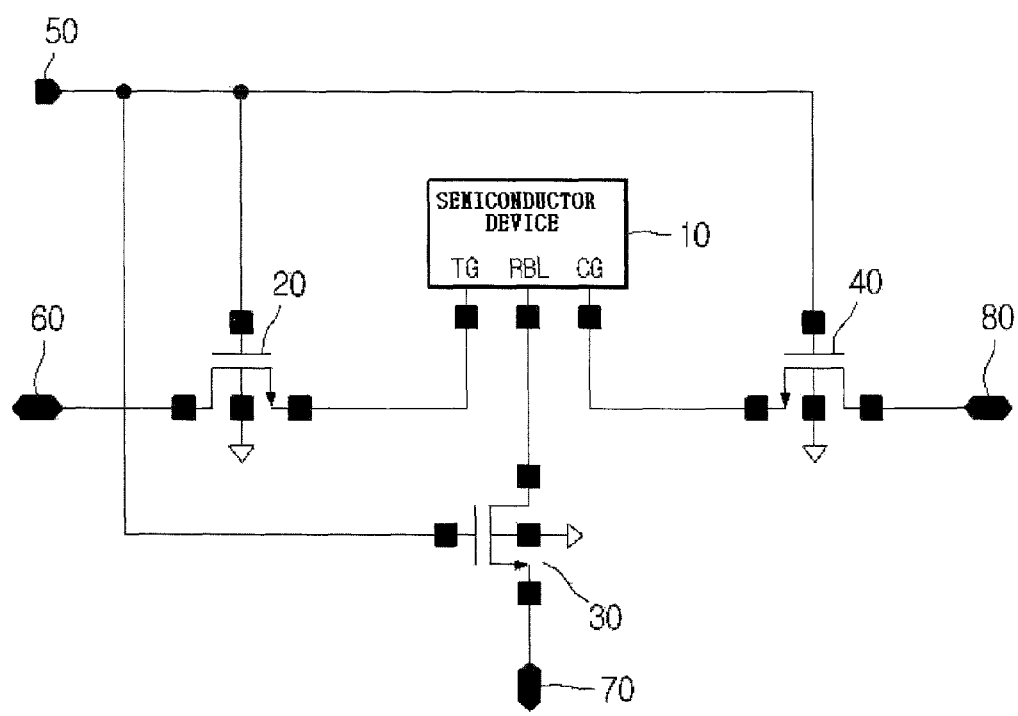

FIG. 1 illustrates a schematic circuit diagram showing components of a semiconductor device control circuit.

As illustrated in FIG. 1, EEPROM 10 has three control voltage terminals CG, RBL and TG for performing operations for programming, reading and erasing data. Control voltage terminals CG, RBL and TG are respectively connected to transistors 20, 30 and 40. Transistors 20, 30 and 40 are N-channel Metal Oxide Semiconductor (NMOS) transistors, which perform the programming, reading and erasing operations of EEPROM 10 by selective transmission of external signals.

The control terminals of transistors 20, 30 and 40 are connected to first external terminal 50 so as to receive an operation voltage. First transistor 20 connected to control voltage terminal TG of EEPROM 10 is connected to second external terminal 60. Second transistor 30 connected to control voltage terminal RBL of EEPROM 10 is connected to third external terminal 70. Third transistor 40 connected to control voltage terminal CG is connected to fourth external terminal 80.

In a EEPROM having such a design, however, due to the process characteristics of a selection transistor, if a gate breakdown voltage is lower than an EEPROM program voltage, it is impossible to program data in the EEPROM.

SUMMARY

Embodiments relate to a semiconductor device, and more particularly, a stable and reliable EEPROM device.

Embodiments relate to an EEPROM device that can include at least one of the following: an EEPROM cell having first, second and third control voltage terminals which perform operations for programming, reading and erasing data, a first transistor which supplies a programming operation voltage to the first control voltage terminal of the EEPROM cell during a programming operation, a second transistor which supplies a ground voltage to the first control voltage terminal of the EEPROM cell, the data of which will not be programmed during the programming operation, and a third transistor connected to the second control voltage terminal and turned on by an address selected for reading the data of the EEPROM cell during a reading operation.

Embodiments relate to an EEPROM device that can include at least one of the following: an EEPROM cell having first, second and third control voltage terminals which perform operations for programming, reading and erasing data, a first transistor which supplies a programming operation voltage to the first control voltage terminal of the EEPROM cell during a programming operation, a second transistor which supplies a ground voltage to the first control voltage terminal of the EEPROM cell, the data of which will not be programmed during the programming operation, a third transistor which is connected to second control voltage terminal and is turned on by an address selected for reading the data of the EEPROM cell during a reading operation, and a logic gate which receives a signal enabled by a selected address and data to be programmed and supplies an output signal to the gates of the first and second transistors, respectively.

In accordance with embodiments, when a gate breakdown voltage is lower than an EEPROM program voltage, it is possible to program data in the EEPROM. It is also possible to program data in an EEPROM cell even in a thin oxide film forming process for a low gate voltage for enhancing the performance of a high-voltage transistor. Moreover, since a current path is not generated when a high voltage used to perform the programming or erasing operation is generated by a charge pump, a charge pump having a small size can be used and thus the area occupied by the device can be reduced.

DRAWINGS

FIG. 1 illustrates a schematic circuit diagram of components of an EEPROM device.

Figure 2:
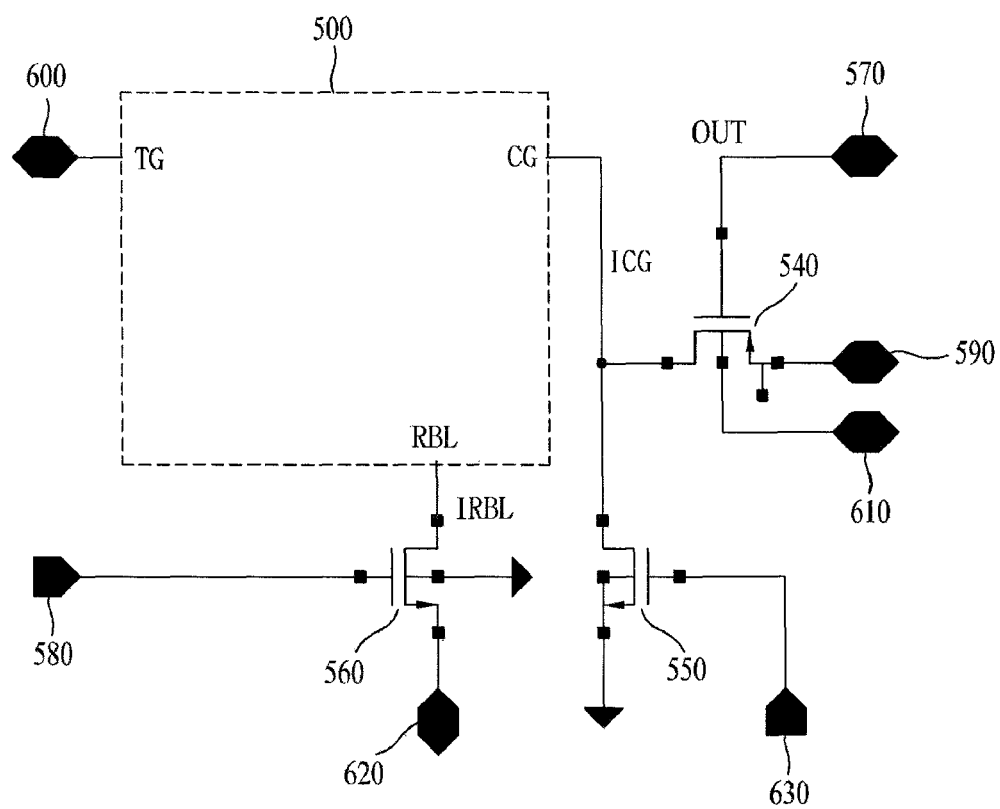
Figure 3:
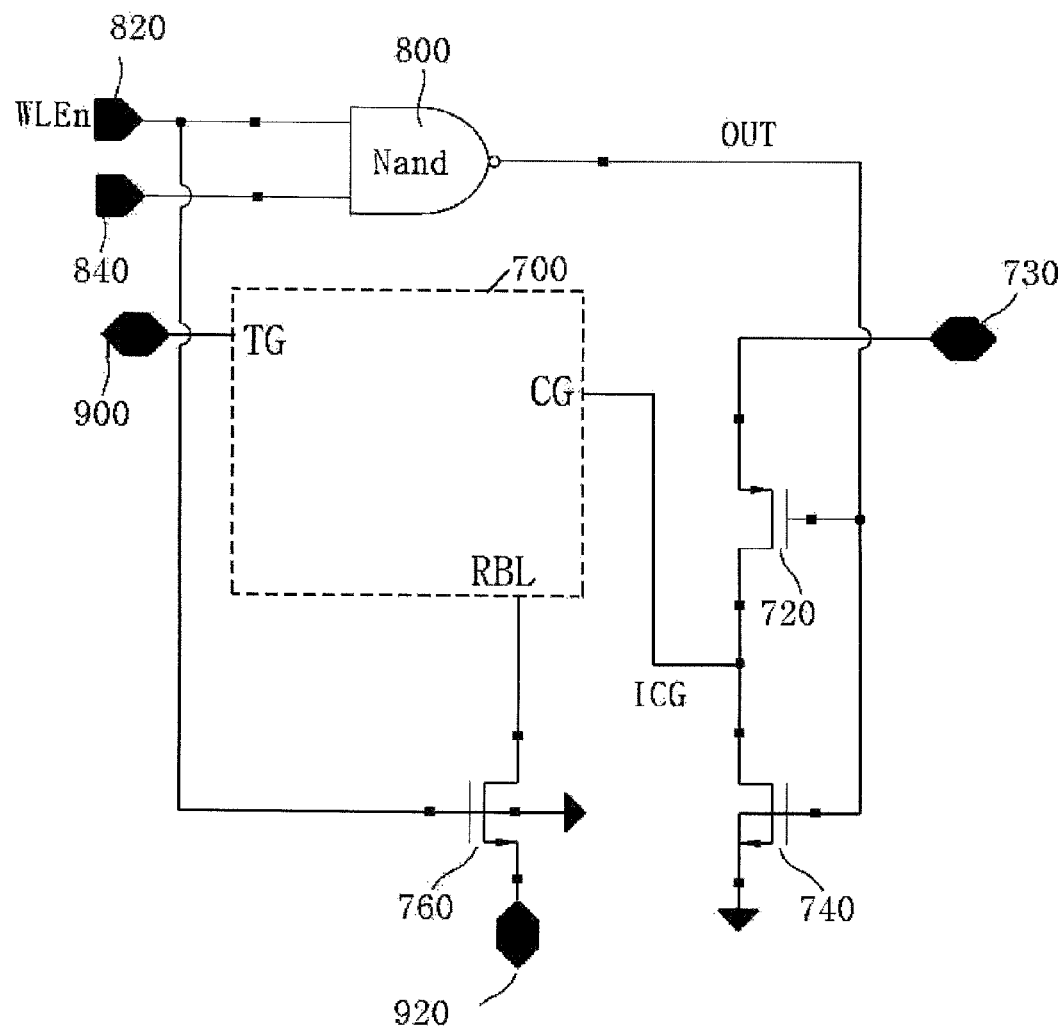

Example FIGS. 2 and 3 illustrate a schematic diagram of an EEPROM device in accordance with embodiments.

DESCRIPTION

Reference will now be made in detail to embodiments, examples of which are illustrated in the accompanying drawings. The configuration and operation of embodiments illustrated in the drawings and described hereinafter will be described in at least one embodiment, without limiting the spirit and scope thereof.

In addition, although the terms used in accordance with embodiments have been selected from generally known and used terms, some of the terms mentioned in the description thereof have been selected at the discretion of the applicant, the detailed meanings of which are described in relevant parts of the description herein. Furthermore, it is required that embodiments is understood, not simply by the actual terms used but by the meanings of each term lying within.

Hereinafter, a voltage switch circuit of a semiconductor device in accordance with embodiments will be described with reference to the accompanying drawings.

As illustrated in example FIG. 2, an EEPROM device in accordance with embodiments includes EEPROM cell 500 and first transistor 540, second transistor 550 and third transistor 560 connected to EEPROM cell 500. EEPROM cell 500 includes first control voltage terminal CG, second control voltage terminal RBL and third control voltage terminal TG for performing operations for programming, reading and erasing data. First transistor 540 and second transistor 550 are connected to first control voltage terminal CG and third transistor 560 is connected to second control voltage terminal RBL.

First transistor 540 includes a P-channel Metal Oxide Semiconductor (PMOS) transistor capable of applying a high voltage to a first control voltage control node ICG connected to first control voltage terminal CG. A source of the PMOS transistor is connected to first input terminal 590 for receiving programming operation voltage CG for performing the programming operation of EEPROM cell 500. A gate of first transistor 540 is connected to second input terminal 570 for applying an on/off voltage WLHVb to first transistor 540, and high voltage VPP is applied as a substrate bias voltage of first transistor 540.

Second transistor 550 is an NMOS transistor for applying 0V to the first control voltage control node ICG of EEPROM cell 500, the data of which will not be programmed during the programming operation. A source of second transistor 550 is connected to a ground terminal, an enable signal control voltage CGDS is applied to a gate of second transistor 550, and a drain of second transistor 550 is connected to first control voltage control node ICG.

Third transistor 560 is an NMOS transistor which is turned on by an address selected during the reading operation. A drain of third transistor 560 is connected to second control voltage terminal RBL. A source of third transistor 560 is connected to a data bit line BL which is input terminal 620 for reading the data. A gate of third transistor 560 is connected to low-voltage word line WLLV which is input terminal 580 of a word line.

Second control voltage terminal RBL is data reading node IRBL for reading the data. Third control voltage terminal TG of EEPROM cell 500 is connected to sixth input terminal 600 which is a node for receiving an erasing voltage for erasing the data of EEPROM cell 500.

The operation of the EEPROM device in accordance with embodiments having the above configuration will be described.

First, when the data of EEPROM cell 500 corresponding to a selected address is programmed, a "Low" signal is applied to sixth input terminal 600, a "High" signal is input to fifth input terminal 580, and 0V is applied from fourth input terminal 620 to data reading node IRBL. Programming operation voltage CG is applied to first input terminal 590, a "Low" signal is applied to second input terminal 570, and programming operation voltage CG applied to first input terminal 590 is applied to first control voltage control node ICG, such that the data of EEPROM cell 500 is programmed. A "Low" signal is input to third input terminal 630 such that second transistor 550 is turned off. Programming operation voltage CG applied to the source of first transistor 540 is 16V, on/off voltage WLHVb of the gate of first transistor 540 is 0V, and body voltage VPP is 16V.

Next, when the data of EEPROM cell 500 corresponding to a selected address is not programmed, a "Low" signal is applied to sixth input terminal 600, a "High" signal is input to fifth input terminal 580, and 0V is applied from fourth input terminal 620 to data reading node IRBL. Programming operation voltage CG is applied to first input terminal 590, and on/off voltage WLHVb having a "High" level is applied to second input terminal 570, such that first transistor 540 is turned off. At this time, a "High" signal is applied to third input terminal 630, second transistor 550 is turned on, and 0V is applied to first control voltage control node ICG, such that the data of EEPROM cell 500 is not programmed.

When the data of EEPROM cell 500 is read, a "Low" signal is applied to sixth input terminal 600, a "High" signal is input to fifth input terminal 580, and a data reading voltage is applied from fourth input terminal 620 to data reading node IRBL, such that the data of EEPROM cell 500 is read. At this time, programming operation voltage CG having a "Low" level is applied to first input terminal 590, and on/off voltage WLHVb having a "High" level is applied to second input terminal 570, such that first transistor 540 is turned off. A "High" signal is applied to third input terminal 630, second transistor 550 is turned on, and 0V is applied to first control voltage control node ICG.

When the data of EEPROM cell 500 is erased, an erasing voltage having a "High" level is applied to sixth input terminal 600 such that the erasing operation of EEPROM cell 500 is performed. A "High" signal is applied to fifth input terminal 580 and 0V is applied from fourth input terminal 620 to data reading node IRBL. A "Low" signal is applied to first input terminal 590, and a "High" signal is applied to second input terminal 570. A "High" signal is input to third input terminal 630, second transistor 550 is turned on, and 0V is applied to first control voltage control node ICG.

The following table shows the voltages corresponding to the operations.

| Mode | WLLV | CG | TG | VPP | BL | CGDS | WLHVb | RBL | ICG |
|---|---|---|---|---|---|---|---|---|---|
| Programming (data"1") | 1.8 V | 16 V | 0 V | 16 V | 0 V | 0 V | 0 V | 0 V | 16 V |
| Programming (data"0") | 1.8 V | 16 V | 0 V | 16 V | 0 V | 0 V | 16 V | 0 V | 0 V |
| Erase | 1.8 V | 0 V | 16 V | 16 V | 0 V | 1.8 V | 16 V | 0 V | 0 V |
| Read | 1.8 V | 0 V | 0 V | 1.8 V | 1 V | 1.8 V | 1.8 V | 1 V | 0 V |

In accordance with embodiments, when a gate breakdown voltage is lower than an EEPROM program voltage, it is possible to program data in the EEPROM cell. It is also possible to program data in an EEPROM cell even in a thin oxide film forming process for a low gate voltage for improving performance of a high-voltage transistor. Since a current path is not generated when a high voltage used to perform the programming or erasing operation is generated by a charge pump, a small charge pump can be used, and thus, the area efficiency of the device can be enhanced.

As illustrated in example FIG. 3, the EEPROM device in accordance with embodiments includes EEPROM cell 700, first transistor 720, second transistor 740 and third transistor 760 connected to EEPROM cell 700, and logic gate 800. EEPROM cell 700 includes first control voltage terminal CG, second control voltage terminal RBL, and third control voltage terminal TG for performing operations for programming, reading and erasing data.

First transistor 720 and second transistor 740 are respectively connected to first control voltage terminal CG and third transistor 760 is connected to second control voltage terminal RBL. First transistor 720 includes a PMOS transistor which applies a high voltage to first control voltage control node ICG. A source of first transistor 720 is connected to first input terminal 730 for receiving a high-voltage operation voltage VPP for performing the programming operation of the EEPROM cell 700, and a gate thereof is connected to an output of the logic gate 800.

Second transistor 740 is an NMOS transistor for applying 0V to first control voltage control node ICG of EEPROM 700, the data of which will not be programmed during the programming operation, a source thereof is connected to a ground terminal, and a gate thereof is connected to the output of logic gate 800.

First transistor 720 and second transistor 740 are connected in an inverter structure, and are turned on/off by the output of logic gate 800 input to the gates of first transistor 720 and second transistor 740.

Logic gate 800 may be, for example, a NAND gate, and includes second input terminal 820 for receiving signal WLEn enabled by a selected address, and third input terminal 840 for receiving data CG to be programmed.

Third transistor 760 is an NMOS transistor which is turned on by word line enable signal WLEn during the reading operation. A source of third transistor 760 is connected to fourth input terminal 920 connected to data bit line IRBL for reading data of EEPROM cell 700. Drain of third transistor is connected to second control voltage terminal RBL of EEPROM cell 700. A gate of third transistor 760 is connected to second input terminal 820. Third control voltage terminal TG of EEPROM 700 is connected to fifth input terminal 900 for applying an erasing voltage for erasing the data of EEPROM cell 700.

Now, the operation of the EEPROM device in accordance with embodiments having the above configuration will be briefly described.

First, when the data of EEPROM cell 700 corresponding to a selected address is programmed, 0V is applied to fifth input terminal 900, a "High" signal is applied to second input terminal 820, and 0V is applied to fourth input terminal 920 to data reading node IRBL. A "High" signal is applied to second input terminal 820 of NAND gate 800, a "High" signal is applied to third input terminal 840, and a "Low" signal is output to output node OUT.

input terminal 900, a "High" signal is input to second input terminal 820, and 0V is applied from fourth input terminal 920 to data reading node IRBL. A "High" signal is applied to second input terminal 820 of NAND gate 800, a "Low" signal is applied to third input terminal 840, and a "High" signal is output to output node OUT.

When the "High" signal of output node OUT of NAND gate 800 is input to the gates of first transistor 720 and second transistor 740, first transistor 720 is turned off, second transistor 740 is turned on, and 0V is applied to first control voltage control node ICG, such that the data of EEPROM cell 700 is not programmed.

When the data of the EEPROM cell 700 is read, 0V is applied to fifth input terminal 900, a "High" signal is applied to second input terminal 820, 0V is applied to third input terminal 840, and a "High" signal is output to the output node of NAND gate 800. First transistor 720 is turned off, second transistor 740 is turned on, and 0V is applied to first control voltage control node ICG. A "Low" signal is applied to fifth input terminal 900. A "High" signal is applied to the gate of third transistor 760 such that third transistor 760 is turned on, the voltage applied from data bit line RDBL for reading the data is applied to data reading node IRBL, such that the data of EEPROM cell 700 is read.

When the data of EEPROM cell 700 is erased, a an erasing voltage having a "High" level is applied to fifth input terminal 900 such that the data of EEPROM cell 700 is erased. A "High" signal is applied to second input terminal 820 and 0V applied to fourth input terminal 920 is applied to data reading node IRBL. A "Low" signal is applied to the eighth input node of NAND gate 800 and a "High" signal is output to output node OUT. The "High" signal of output node OUT is applied to the gates of first transistor 720 and second transistor 740, first transistor 720 is turned off, second transistor 740 is turned on, and 0V is applied to first control voltage control node ICG.

The following table shows the voltages corresponding to the operations.

| Mode | WLEn | CG | TG | VPP | RDBL | RBL | ICG |
|---|---|---|---|---|---|---|---|
| Programming (Data"1") | 5 V | 5 V | 0 V | 16 V | 0 V | 0 V | 16 V |
| Programming (Data"0") | 5 V | 0 V | 0 V | 16 V | 0 V | 0 V | 0 V |
| Erase | 5 V | 0 V | 16 V | 16 V | 0 V | 0 V | 0 V |
| Read | 5 V | 0 V | 0 V | 5 V | 2 V | 2 V | 0 V |

If the "LOW" signal of output node OUT is input to the gates of first transistor 720 and second transistor 740, second transistor 740 is turned off, first transistor 720 is turned on, and programming operation voltage VPP is applied to first control voltage control node ICG, such that the data is programmed in EEPROM cell 700.

Next, when the data of EEPROM cell 700 corresponding to a selected address is not programmed, 0V is applied to fifth In accordance with embodiments, if the length of first transistor 720 is greater than that of second transistor 740 and the width of first transistor 720 is less than that of second transistor 740, the weak output of first transistor 720 is lowered to 0V.

If the EEPROM device in accordance with embodiments uses a selection transistor including an NMOS transistor, it is possible to apply a high voltage for performing a programming operation to the EEPROM using a voltage lower than a breakdown voltage of the NMOS transistor, by using a voltage switch including a NAND gate and a PMOS transistor.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electrically erasable programmable read-only memory (EEPROM) device comprising:
    an EEPROM cell having first, second and third control voltage terminals which perform operations for programming, reading and erasing data, respectively;
    a first transistor configured to supply a programming operation voltage CG to the first control voltage terminal of the EEPROM cell during the programming operation;
    a second transistor configured to supply a ground voltage to the first control voltage terminal of the EEPROM cell, the data of which will not be programmed during the programming operation;
    a third transistor connected to the second control voltage terminal and turned on by an address selected for reading the data of the EEPROM cell during the reading operation; and
    a logic gate configured to receive a signal enabled by a selected address and data to be programmed and supplies an output signal to the gates of the first transistor and the second transistor, respectively.

2. The. EEPROM device of claim 1, wherein the programming operation voltage CG is applied to a source of the first transistor, an on/off voltage WLHVb is applied to a gate of the first transistor, and a high voltage VPP is applied as a body voltage.

3. The EEPROM device of claim 2, wherein the programming operation voltage CG is applied to the source of the first transistor is 16V, the on/off voltage WLHVb applied to the gate of the first transistor is 0V, and the body voltage is 16V, when the programming operation of the EEPROM cell is performed.

4. The EEPROM device of claim 1, wherein a source of the second transistor is connected to the ground voltage, an enable signal control voltage CGDS is applied to a gate of the second transistor, a drain of the second transistor is connected to the first control voltage terminal, and the first control voltage terminal is connected to a first control voltage control node ICG.

5. The EEPROM device of claim 4, wherein a drain of the first transistor and the drain of the second transistor are connected to the first control voltage control node ICG connected to the first control voltage terminal.

6. The EEPROM device of claim 1, wherein a high-voltage signal is applied to the third control voltage terminal when the erasing operation of the EEPROM cell is performed, and the third control voltage terminal is a node TG for applying an erasing voltage.

7. The EEPROM device of claim 1, wherein the first transistor comprises a P-channel Metal Oxide Semiconductor (PMOS) transistor, and the second transistor and the third transistor each comprise a N-channel Metal Oxide Semiconductor (NMOS) transistor.

8. The EEPROM device of claim 7, wherein a drain of the third transistor is connected to the second control voltage terminal, a source of the third transistor is connected to a data bit line BL for reading the data, a gate of the third transistor is connected to a low-voltage word line WLLV which is an input terminal of a word line, and the second control voltage terminal is a data reading node IRBL for reading the data.

9. The EEPROM device of claim 1, wherein a drain of the first transistor and a drain of the second transistor are connected to a first control voltage control node for controlling the first control voltage terminal.

10. An electrically erasable programmable read-only memory (EEPROM) device comprising:
    an EEPROM cell having first, second and third control voltage terminals adapted to perform operations for programming, reading and erasing data, respectively;
    a first transistor configured to supply a programming operation voltage to the first control voltage terminal of the EEPROM cell during the programming operation;
    a second transistor configured to supply a ground voltage to the first control voltage terminal of the EEPROM cell, the data of which will not be programmed during the programming operation;
    a third transistor which is connected to the second control voltage terminal and which is turned on by an address selected for reading the data of the EEPROM cell during the reading operation; and
    a logic gate configured to receive a signal enabled by a selected address and data to be programmed and supplies an output signal to the gates of the first transistor and the second transistor, respectively.

11. The EEPROM device of claim 10, wherein the first transistor comprises a P-channel Metal Oxide Semiconductor (PMOS) transistor, the second transistor and the third transistor each comprises an N-channel Metal Oxide Semiconductor (NMOS) transistor.

12. The EEPROM device of claim 11, wherein the first transistor and the second transistor are each connected in an inverter structure.

13. The EEPROM device of claim 12, wherein a programming operation voltage VPP is applied to a source of the first transistor, and a ground voltage is applied to a source of the second transistor.

14. The EEPROM device of claim 10, wherein the logic gate comprises a NAND gate, and input voltages of the NAND gate comprise a word line enable signal WLEn operated by a selected address and a voltage CG for controlling the NAND gate.

15. The EEPROM device of claim 14, wherein the voltage of the word line enable signal WLEn is 5V, the gate control voltage CG is 5V, and the programming operation voltage VPP is 16V, when the programming operation of the EEPROM cell is performed.

16. The. EEPROM device of claim 10, wherein the logic gate turns the first transistor on in order to program the data of the EEPROM cell during the programming operation of the EEPROM cell and applies the programming operation voltage to the first control voltage terminal.

17. The EEPROM device of claim 10, wherein the logic gate turns the second transistor on so as to disable a portion of the data of the EEPROM cell to be programmed during the programming operation of the EEPROM cell, and applies the ground voltage to the first control voltage terminal.

18. The EEPROM device of claim 10, wherein the second control voltage terminal comprises a data reading node RBL for reading data to a bit line during the reading operation of the EEPROM cell.

19. The EEPROM device of claim 10, wherein a high-voltage signal is applied to the third control voltage terminal and the third control voltage terminal comprises a node TG for applying an erasing voltage during the erasing operation of the EEPROM cell.

20. A device comprising:
- an EEPROM cell having a first voltage terminal adapted to perform an operation for programming data, a second voltage terminal adapted to perform an operation for reading data, and a third control voltage terminal adapted to perform an operation for erasing data;
- a first transistor configured to supply a programming operation voltage to the first control voltage terminal during the programming operation;
- a second transistor configured to supply a ground voltage to the first control voltage terminal, the data of which will not be programmed during the programming operation;
- a third transistor connected to the second control voltage terminal and which is turned on by an address selected for reading the data of the EEPROM cell during the reading operation; and
- a logic gate which, receives a signal enabled by a selected address and data to be programmed and supplies an output signal to a gate of the first transistor and a gate of the second transistor.

* * * * *